US010381254B2

(12) United States Patent
Chiou et al.

(10) Patent No.: US 10,381,254 B2
(45) Date of Patent: Aug. 13, 2019

(54) WAFER DEBONDING AND CLEANING APPARATUS AND METHOD

(71) Applicant: TAIWAN SEMICONDUCTOR MANUFACTURING COMPANY, LTD., Hsinchu (TW)

(72) Inventors: Wen-Chih Chiou, Zhunan Township (TW); Yu-Liang Lin, Hsinchu (TW); Hung-Jung Tu, Hualien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 242 days.

(21) Appl. No.: 14/479,806

(22) Filed: Sep. 8, 2014

(65) Prior Publication Data
US 2014/0374031 A1 Dec. 25, 2014

Related U.S. Application Data

(63) Continuation-in-part of application No. 13/306,625, filed on Nov. 29, 2011, now Pat. No. 9,390,949.

(51) Int. Cl.
*H01L 21/67* (2006.01)
*H01L 21/683* (2006.01)
*H01L 21/02* (2006.01)

(52) U.S. Cl.
CPC .... *H01L 21/6835* (2013.01); *H01L 21/02057* (2013.01); *H01L 21/67092* (2013.01);
(Continued)

(58) Field of Classification Search
CPC ............. H01L 2924/00; H01L 21/6835; H01L 2924/00014; H01L 2924/0002; H01L 2221/68327
(Continued)

(56) References Cited

U.S. PATENT DOCUMENTS 5,362,681 A * 11/1994 Roberts, Jr. ............ B28D 1/003
438/464
5,391,917 A 2/1995 Gilmour et al.
(Continued)

FOREIGN PATENT DOCUMENTS

JP 3494765 B2 2/2004
JP 2008294233 A 12/2008
(Continued)

OTHER PUBLICATIONS

Office Action dated Feb. 20, 2014 from corresponding application No. TW 101112188.
(Continued)

*Primary Examiner* — David G Cormier
*Assistant Examiner* — Thomas Bucci
(74) *Attorney, Agent, or Firm* — Eschweiler & Potashnik, LLC (57) ABSTRACT

A wafer debonding and cleaning apparatus comprises a wafer debonding module configured to separate a semiconductor wafer from a carrier wafer. The wafer debonding and cleaning apparatus also comprises a first wafer cleaning module configured perform a first cleaning process to clean a surface of the semiconductor wafer. The wafer debonding and cleaning apparatus further comprises an automatic wafer handling module configured to transfer the semiconductor wafer from one of the wafer debonding module or the first wafer cleaning module to the other of the wafer debonding module or the first wafer cleaning module. The semiconductor wafer has a thickness ranging from about 0.20 µm to about 3 mm.

20 Claims, 6 Drawing Sheets

(52) U.S. Cl.
CPC .. *H01L 21/67173* (2013.01); *H01L 21/67207* (2013.01); *H01L 2221/68381* (2013.01); *Y10T 156/11* (2015.01); *Y10T 156/19* (2015.01)

(58) Field of Classification Search
USPC ........ 134/56 R, 26, 19, 1.3, 3, 32, 34, 61, 1, 134/103.2, 105, 137, 16, 18, 1.1, 902; 438/464, 458, 455, 459, 460, 463, 106, 438/118, 457, 977
See application file for complete search history.

(56) References Cited

U.S. PATENT DOCUMENTS

| | | | |
|---|---|---|---|
| 5,510,298 A | 4/1996 | Redwine | |
| 5,767,001 A | 6/1998 | Bertagnolli et al. | |
| 5,998,292 A | 12/1999 | Black et al. | |
| 6,122,566 A * | 9/2000 | Nguyen | H01L 21/67167 438/908 |
| 6,184,060 B1 | 2/2001 | Siniaguine | |
| 6,206,441 B1 | 3/2001 | Wen et al. | |
| 6,322,903 B1 | 11/2001 | Siniaguine et al. | |
| 6,342,434 B1 * | 1/2002 | Miyamoto | G06K 19/077 438/464 |
| 6,426,275 B1 * | 7/2002 | Arisa | H01L 21/6835 257/E21.599 |
| 6,448,168 B1 | 9/2002 | Rao et al. | |
| 6,465,892 B1 | 10/2002 | Suga | |
| 6,472,293 B1 | 10/2002 | Suga | |
| 6,526,329 B2 * | 2/2003 | Tateyama | G03F 7/7075 414/806 |
| 6,538,333 B2 | 3/2003 | Kong | |
| 6,543,988 B2 | 4/2003 | Hsiao et al. | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,837,978 B1 * | 1/2005 | Hey | C25D 21/12 204/224 R |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,100,826 B1 * | 9/2006 | Phan | G06Q 10/087 235/385 |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,364,922 B2 * | 4/2008 | Shimizu | G05B 19/4067 118/663 |
| 7,935,780 B2 | 5/2011 | Hong et al. | |
| 2003/0008437 A1 | 1/2003 | Inoue et al. | |
| 2004/0089421 A1 * | 5/2004 | Komandur | H01L 21/67028 156/345.32 |
| 2004/0197179 A1 * | 10/2004 | Achkire | H01L 21/6704 414/618 |
| 2005/0233547 A1 * | 10/2005 | Noda | B32B 43/006 438/459 |
| 2006/0162660 A1 * | 7/2006 | Shimizu | G05B 19/4067 118/719 |
| 2008/0099149 A1 | 5/2008 | Codding et al. | |
| 2009/0075217 A1 | 3/2009 | Brodsky | |
| 2009/0314438 A1 * | 12/2009 | Iwata | H01L 21/02057 156/753 |
| 2010/0148353 A1 | 6/2010 | Kim et al. | |
| 2010/0263794 A1 * | 10/2010 | George | B32B 43/006 156/707 |
| 2010/0330788 A1 | 12/2010 | Yu et al. | |
| 2011/0041764 A1 * | 2/2011 | Webb | C23C 16/4583 118/715 |
| 2011/0126860 A1 * | 6/2011 | Hyakutake | H01L 21/67057 134/19 |
| 2011/0146901 A1 * | 6/2011 | Hermanowski | H01L 21/67132 156/249 |
| 2012/0080052 A1 * | 4/2012 | Canale | B23Q 3/084 134/1.1 |
| 2012/0080150 A1 * | 4/2012 | Riege | H01L 21/67092 156/752 |
| 2012/0318432 A1 * | 12/2012 | Nishibayashi | H01L 21/187 156/64 |

FOREIGN PATENT DOCUMENTS

| | | | | |
|---|---|---|---|---|
| JP | 2011187716 A * | 9/2011 | | H01L 21/187 |
| JP | 2014053465 A | 3/2014 | | |
| KR | 20090040781 A | 4/2009 | | |
| TW | 201039297 | 11/2010 | | |
| TW | 201039298 | 11/2010 | | |
| WO | WO-2006081290 A2 * | 8/2006 | | C23C 18/1628 |

OTHER PUBLICATIONS

Korean Office Action dated Apr. 22, 2016 in connection with Korean Application No. 9-5-2016-029487586.
Brewer Science WaferBOND HT-10.10 Temporary Wafer Bonding Material brochure; Aug. 9, 2011.

* cited by examiner

WAFER DEBONDING AND CLEANING APPARATUS AND METHOD

PRIORITY

The present application is a continuation-in-part of U.S. application Ser. No. 13/306,625, filed Nov. 29, 2011, the entirety of which is incorporated herein by reference.

BACKGROUND

To form a three dimensional integrated circuit (3DIC), features are formed on both sides of a semiconductor wafer. In order to form features on a reverse side of the semiconductor wafer, the semiconductor wafer is bonded to a carrier wafer. The carrier wafer permits handling of the semiconductor wafer without damaging the features formed on a front side of the semiconductor wafer. After forming the features on the reverse side, the carrier wafer is debonded from the semiconductor wafer. The debonding process leaves residual bonding material adhered to the front surface of the semiconductor wafer. The wafer is cleaned to remove the residual bonding material before the semiconductor wafer is diced and/or packaged.

Semiconductor wafers have a thickness ranging from about 0.2 µm to about 3 mm. Thin semiconductor wafers are often supported across the entire surface of the semiconductor wafer to avoid breaking or warping during transportation between the debonding and cleaning processes. A film frame is sometimes positioned to support the semiconductor wafer. The cleaning process for thin semiconductor wafers is sometimes performed manually to prevent the chemicals used during cleaning from penetrating between the film frame and the semiconductor wafer and damaging the features formed on the surface of the semiconductor wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DESCRIPTION

It is understood that the following disclosure provides many different embodiments, or examples, for implementing different features. Specific examples of components and arrangements are described below to simplify the present disclosure. These are, of course, merely examples and are not intended to be limiting.

Figure 1:
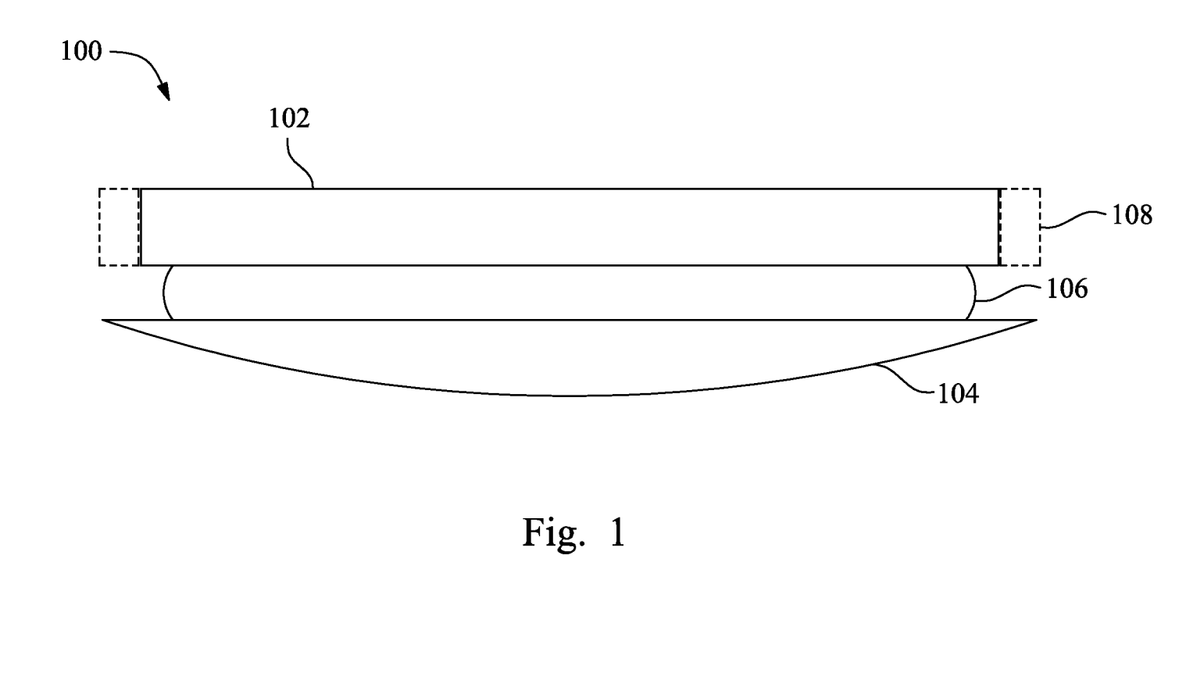
FIG. 1 is a side view of a semiconductor wafer assembly, in accordance with one or more embodiments.

FIG. 1 is a side view of a wafer assembly 100. Wafer assembly 100 includes a semiconductor wafer 102 bonded to a carrier wafer 104 by an adhesive 106. In some embodiments, the wafer assembly 100 optionally comprises a film frame 108 that is configured to support the semiconductor wafer 102. In some embodiments, semiconductor wafer 102 is silicon. In other embodiments, semiconductor wafer 102 is germanium, gallium arsenic, or other suitable semiconductor material. In some embodiments, carrier wafer 104 is sapphire. In other embodiments, carrier wafer 104 is silicon, a thermoplastic polymer, oxide, carbide, or other suitable material. In some embodiments, adhesive 106 is a spin-on adhesive. In other embodiments, adhesive 106 is a laminated tape, wax, or other suitable material. In some embodiments, film frame 108 comprises a polymer film or other suitable material.

Figure 2:
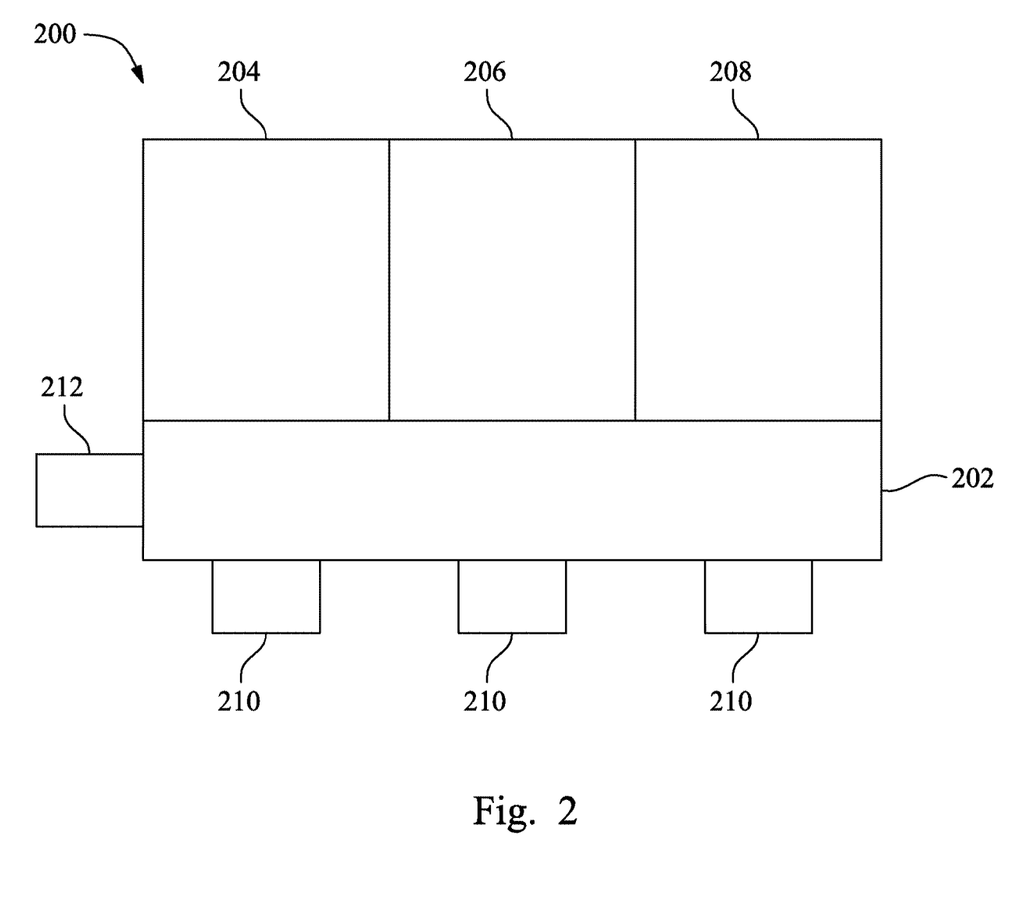
FIG. 2 is a block diagram of a wafer debonding and cleaning apparatus, in accordance with one or more embodiments.

FIG. 2 is a block diagram of a wafer debonding and cleaning apparatus 200, in accordance with one or more embodiments. Wafer debonding and cleaning apparatus includes an automatic wafer handling module 202 for transferring/transporting semiconductor wafer 102 (FIG. 1) and/or wafer assembly 100 (FIG. 1) to/from a wafer debonding module 204, a first wafer cleaning module 206, and a second wafer cleaning module 208. Wafer debonding module 204 is configured to separate semiconductor wafer 102 from carrier wafer 104 (FIG. 1). Wafer cleaning modules 206 and 208 are configured to remove adhesive 106 from semiconductor wafer 102. Wafer debonding and cleaning apparatus 200 further includes storage units 210 for storing multiple semiconductor wafers 102 or wafer assemblies 100. Wafer debonding and cleaning apparatus 200 also includes a scanning module 212 configured to scan barcodes on semiconductor wafer 102 for tracking purposes.

In some embodiments, wafer debonding and cleaning apparatus 200 is a single apparatus. In other embodiments, wafer debonding and cleaning apparatus 200 is a compilation of different apparatuses. One of ordinary skill in the art would recognize as the distance between apparatuses increases the time to transport wafer assembly 100 or semiconductor wafer 102 to/from the different apparatuses increases.

Figure 3A:
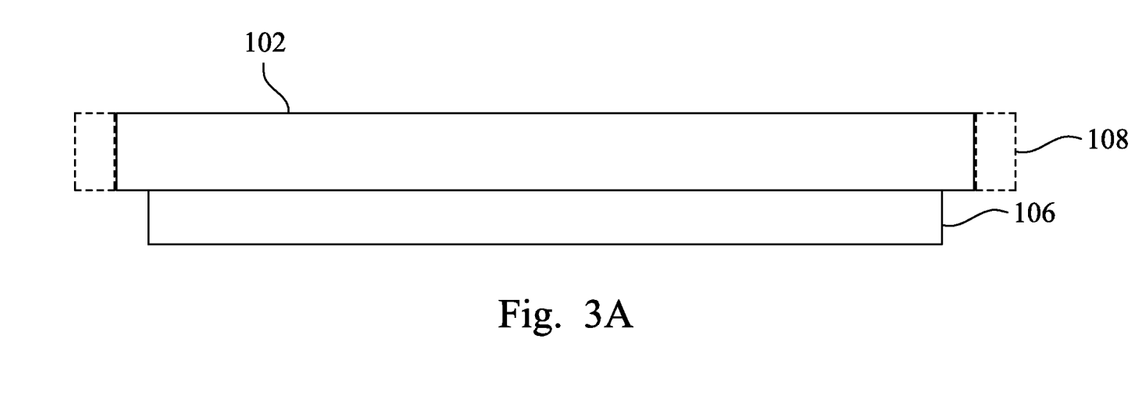
FIG. 3A-3B are side views of a semiconductor wafer at various stages of processing, in accordance with one or more embodiments.
Figure 3B:
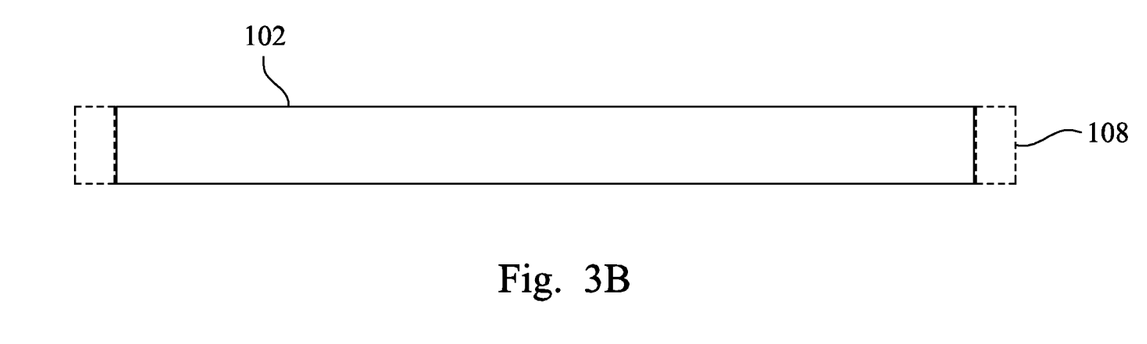

Manually transporting wafer assemblies sometimes results in an increase in wafer assembly breakage and warping due to human error. Wafer assembly breakage occurs when semiconductor wafer 102 is fractured. Automatic wafer handling module 202 removes the need for manual transportation of the wafer assembly thus increasing production yield and decreased production cost. In some embodiments, the automatic wafer handling module 202 is a robotic arm. In some embodiments, automatic wafer handling module 202 includes multiple robotic arms. In some embodiments, the robotic arm comprises a blade portion configured to support the semiconductor wafer 102 or wafer assembly 100. In some embodiments, the blade portion includes sensors to enhance the positioning of the blade portion with respect to semiconductor wafer 102 or wafer assembly 100 (FIG. 1) to prevent scratching a surface of semiconductor wafer 102 (FIGS. 1 and 3A-3B). In some embodiments, the blade portion is substantially U-shaped to minimize the amount of contact between the blade portion and the wafer assembly. In other embodiments, the blade portion is circular, rectilinear or another suitable shape for supporting and moving semiconductor wafer 102 or wafer assembly 100.

The blade portion does not need to evenly support the entire surface of the wafer assembly because semiconductor wafer 102 has a thickness ranging from about 300 μm to about 3 mm. Semiconductor wafer 102 has enhanced mechanical strength capable of withstanding the debonding and cleaning processes without significant risk of warping or fracture due to the larger thickness.

In use, automatic wafer handling module 202 loads wafer assembly 100, into wafer debonding module 204. Following loading, wafer assembly 100 is transferred to a debonding stage. On the debonding stage, wafer assembly 100 is irradiated to weaken an adhesive 106 bonding semiconductor wafer 102 and carrier wafer 104. In some embodiments, wafer assembly 100 is irradiated with ultraviolet light. In other embodiments, wafer assembly 100 is irradiated with laser light, thermal energy, electromagnetic radiation, or other suitable types of energy to weaken the bond between carrier wafer 104 and semiconductor wafer 102. Following irradiation, wafer assembly 100 is transferred off the debonding stage and carrier wafer 104 is lifted off semiconductor wafer 102. In some embodiments, a portion of adhesive 106 remains attached to each of semiconductor wafer 102 and carrier wafer 104. Carrier wafer 104 is cleaned and stored for use with another semiconductor wafer. Following the debonding process, semiconductor wafer 102 resembles the structure shown in FIG. 3A.

Automatic wafer handling module 202 removes semiconductor wafer 102 from wafer debonding module 204 following removal of the carrier wafer 104. Automatic wafer handling module 202 then transfers semiconductor wafer 102, shown in FIG. 3A, to first cleaning module 206 or second cleaning module 208.

After semiconductor wafer 102 is loaded into the cleaning module 206 or 208, semiconductor wafer 102 (FIG. 3A) is positioned on a cleaning stage. The cleaning stage is configured to rotate, e.g., by the use of a motor, semiconductor wafer 102. In some embodiments, a nozzle positioned above the cleaning stage supplies a solvent solution onto the surface of semiconductor wafer 102 bonded to residual adhesive 106. In an embodiment, the solvent solution comprises of deionized water, tetramethylammonium hydroxide (TMAH), potassium hydroxide (KOH), methylpyrrolidone (NMP), isopropanol (IPA), ethanol, acetone, hydrogen peroxide (H2O2), dimethyl sulfoixde (DMSO), limonene, menthanol, and tetrabutylammonium fluoride trihydrate. In some embodiments, cleaning module 206 or 208 further includes brushes to help remove residual adhesive 106 from semiconductor substrate 102. Some embodiments of cleaning module 206 or 208 use the nozzle to spray high pressure air or liquid onto semiconductor wafer 102 to remove residual adhesive 106. Other embodiments of the cleaning module 206 or 208 use the nozzle to introduce different chemicals onto semiconductor wafer 102 to chemically remove residual adhesive 106 from semiconductor wafer 102. Following completion of the wafer cleaning process, residual adhesive 106 is sufficiently removed from semiconductor wafer 102 for further processing, e.g., packing and dicing, as shown in FIG. 3B. Automatic wafer handling module 202 removes semiconductor wafer 102 from cleaning module 206 or 208.

Wafer debonding and cleaning apparatus 200 includes the second cleaning module 208, because the cleaning process is more time consuming than the wafer debonding process. By including second cleaning module 208, wafer debonding and cleaning apparatus 200 increases efficiency by eliminating a production bottleneck at the wafer cleaning process. Automatic wafer handling module 202 is equipped with a control system (not shown) to determine which cleaning module 206 or 208 to use. The control system connects to cleaning modules 206 and 208 and to automatic wafer handling module 202 and determines whether either cleaning module is available to accept semiconductor wafer 102 (FIG. 3A).

In some embodiments, automatic wafer handling module 202 places a wafer assembly 100 or a semiconductor wafer 102 in one of storage units 210 when the wafer assembly 100 or the semiconductor wafer 102 is not in either debonding module 204 or cleaning modules 206 or 208. Storage units 210 include support arrangements designed to support a plurality of wafer assemblies 100 or semiconductor wafers 102. The spacing between wafer assemblies 100 is sufficient to allow the automatic wafer handling module 202 to insert and remove wafer assemblies 100 or semiconductor wafers 102 without contacting adjacent wafer assemblies 100 or semiconductor wafers 102 to avoid damaging stored wafers.

In one embodiment, storage units 210 are stationary. In a wafer debonding and cleaning apparatus 200 which has stationary storage units 210, automatic wafer handling module 202 removes wafer assembly 100 or semiconductor wafer 102 from a first storage unit 210 and loads the wafer assembly 100 or semiconductor wafer 102 into a module 204, 206 or 208. After completion of the process in module 204, 206 or 208 automatic wafer handling module 202 places wafer assembly 100 or semiconductor wafer 102 in a second storage unit 210 different from the first storage unit 210 in order to move the wafer assemblies 100 or semiconductor wafers 102 further along a processing line. For example, after automatic wafer handling module 202 removes wafer assembly 100 from first storage unit 210 and loads the wafer assembly 100 into wafer debonding module 204. Automatic wafer handling module 202 then removes semiconductor wafer 102 from debonding module 204 and places the semiconductor wafer 102 in a second storage unit 210 closer to cleaning module 206 or 208.

In another embodiment, storage units 210 are movable, e.g., front opening unified pods (FOUPs), and transfer wafer assemblies 100 or semiconductor wafers 102 in groups from a present location to a new location. The new location is either adjacent a different module in wafer debonding and cleaning apparatus 200 or to another apparatus, such as a dicing or packaging apparatus. In a wafer debonding and cleaning apparatus 200 which has movable storage units 210, automatic wafer handling module 202 removes a wafer assembly 100 or semiconductor wafer 102 from storage unit 210 and loads the wafer assembly 100 or the semiconductor wafer 102 into a module 204, 206 or 208 and returns the wafer assembly 100 or the semiconductor wafer 102 back to the same storage unit 210 following completion of the process in the module 204, 206 or 208. Storage unit 210 then moves the wafer to a new location.

In still another embodiment, automatic wafer handling module 202 includes a robotic arm associated with each module 204, 206 and 208 and storage units 210 are movable. Each robotic arm removes wafer assembly 100 or semiconductor wafer 102 from a storage unit 210 and loads the wafer assembly or the semiconductor wafer into the associated module 204, 206 or 208. After the module processing is completed, the associated robotic arm removes wafer assembly 100 or semiconductor wafer 102 from the module 204, 206 or 208 and stores the wafer assembly 100 or the semiconductor wafer 102 in the same storage unit 210.

Movable storage units 210 transfer wafer assemblies 100 or semiconductor wafers 102 between locations near each module 204, 206 and 208, to allow robotic arms associated with each module 204, 206 or 208 to continue loading and removing wafer assemblies 100 or semiconductor wafers 102 without having to transfer the wafer assemblies 100 or the semiconductor wafers 102 between modules.

Wafer debonding and cleaning apparatus 200 includes a wafer scanner 212 for scanning a barcode attached to each semiconductor wafer 102 prior to processing. Wafer scanner 212 scans the barcode upon semiconductor wafer 102 entering the wafer debonding and cleaning apparatus 200. Wafer scanner 212 transmits the scanned barcode to a computer system to allow tracking of semiconductor wafers 102 throughout the production process. The ability to track semiconductor wafers 102 throughout the production process allows production errors to be located and corrected rapidly.

Figure 4:
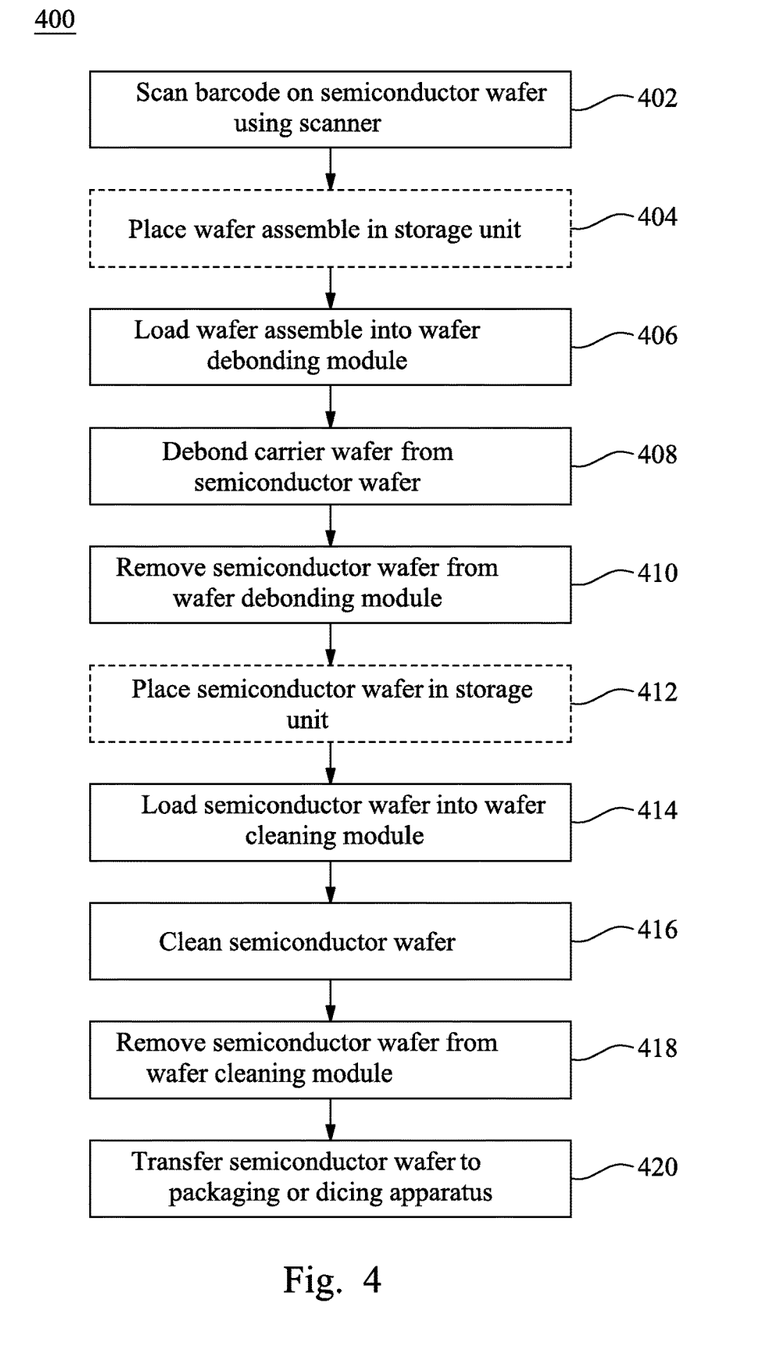
FIG. 4 is a flow chart of a method of using the wafer debonding and clean apparatus, in accordance with one or more embodiments.

FIG. 4 is a flow chart of a method 400 of using a wafer debonding and cleaning apparatus such as wafer debonding and cleaning apparatus 200 (FIG. 2), in accordance with one or more embodiments. Though discussed with regard to wafer debonding and cleaning apparatus 200, method 400 is capable of being performed by other wafer debonding and cleaning apparatuses such as those discussed herein or otherwise suitably configured to perform method 400. Method 400 begins with step 402 in which the barcode on the semiconductor wafer 102 (FIG. 1) is scanned by wafer scanner 212 (FIG. 2). Step 404 is an optional step, in which automatic wafer handling module 202 (FIG. 2) places wafer assembly 100 (FIG. 1) into a storage unit 210 (FIG. 2).

In step 406, automatic wafer handling module 202 loads wafer assembly 100, into wafer debonding module 204 (FIG. 2). If optional step 404 is included, automatic wafer handling module 202 removes wafer assembly 100 from storage unit 210 and loads wafer assembly 100 into wafer debonding module 204. If optional step 404 is not included, automatic wafer handling module 202 transfers wafer assembly 100 directly from wafer scanner 212 to wafer debonding module 204.

In step 408, wafer debonding module 204 debonds carrier wafer 104 from semiconductor wafer 102. Following the debonding process, semiconductor wafer 102 (FIG. 3A), is removed from wafer debonding module 204 and carrier wafer 104 is cleaned and stored for use with subsequent wafer assemblies, in step 410.

In an optional step 412, automatic wafer handling module 202 transfers the semiconductor wafer 102 to a storage unit 210. In step 414, automatic wafer handling module 202 loads the semiconductor wafer 102 (FIG. 3A), into wafer cleaning module 206 (FIG. 2) or 208 (FIG. 2). If optional step 412 is included, automatic wafer handling module 202 removes semiconductor wafer 102 from storage unit 210 and loads the semiconductor wafer 102 into wafer cleaning module 206 or 208. If optional step 412 is not included, automatic wafer handling module 202 takes semiconductor wafer 102 directly from wafer debonding module 204 to wafer cleaning module 206 or 208. The control system (not shown) connected to automatic wafer handling module 202 and wafer cleaning modules 206 and 208 determines to which wafer cleaning module 206 or 208, semiconductor wafer 102 is transferred.

In step 416, semiconductor wafer 102 is cleaned in wafer cleaning module 206 or 208, to produce semiconductor wafer 102 (FIG. 3B). Following the cleaning process, semiconductor wafer 102 is removed from wafer cleaning module 206 or 208, in step 418.

In step 420, semiconductor wafer 102 is sent to a packaging or dicing apparatus for further processing of the semiconductor wafer 102. If wafer debonding and cleaning apparatus 200 includes movable storage units 210, semiconductor wafer 102 is placed in the storage unit 210 and storage unit 210 is transferred to the packaging or dicing apparatus. If wafer debonding and cleaning apparatus 200 includes stationary storage units 210, semiconductor wafer 102 is placed on a conveyor, a separate movable storage unit or some other device for transporting semiconductor wafer 102 to the dicing and/or packaging device.

Figure 5:
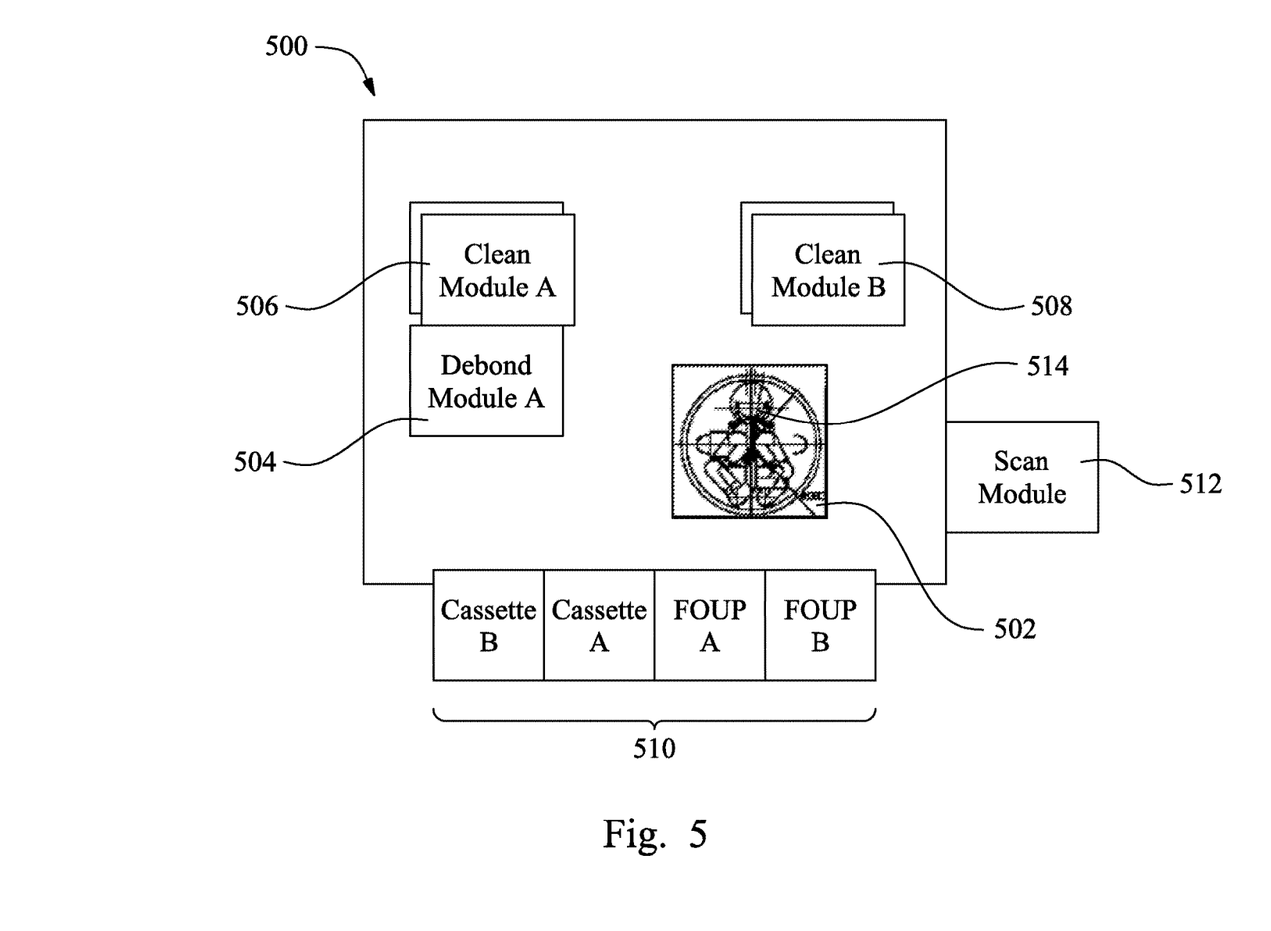
FIG. 5 is a block diagram of a wafer debonding and cleaning apparatus, in accordance with one or more embodiments.

FIG. 5 is a block diagram of a wafer debonding and cleaning apparatus 500, in accordance with one or more embodiments. Wafer debonding and cleaning apparatus 500 includes features similar to those discussed with respect to wafer debonding and cleaning apparatus 200 (FIG. 2), with the reference numerals increased by 300. In some embodiments, wafer debonding and cleaning apparatus 500 is configured to handle wafer assemblies 100 (FIG. 1) that include the film frame 108 (FIG. 1) and/or a semiconductor wafer 102 (FIG. 1) that has a thickness ranging from about 0.20 µm to about 3 mm.

Wafer debonding and cleaning apparatus 500 includes an automatic wafer handling module 502 for transferring/transporting semiconductor wafer 102 to/from various modules of the wafer debonding and cleaning apparatus 500. Wafer debonding and cleaning apparatus 500 also includes a wafer debonding module 504 for separating semiconductor wafer 102 from carrier wafer 104 (FIG. 1), two or more first wafer cleaning modules 506 and two or more second wafer cleaning modules 508 for removing adhesive 106 from semiconductor wafer 102. The first wafer cleaning modules 506 and the second wafer cleaning modules 506 are configured to be used for different types of cleaning operations. In some embodiments, first wafer cleaning modules 506 and the second wafer cleaning modules 506 are configured to be used for the same types of cleaning operations.

Wafer debonding and cleaning apparatus 500 further includes storage units 510 for storing multiple semiconductor wafers 102 or wafer assemblies 100. In some embodiments, wafer debonding and cleaning apparatus 500 is a single apparatus. In other embodiments, wafer debonding and cleaning apparatus 500 is a compilation of different apparatuses. One of ordinary skill in the art would recognize as the distance between apparatuses increases the time to transport wafer assembly 100 or semiconductor wafer 102 to/from the different apparatuses increases.

Wafer debonding and cleaning apparatus 500 includes a scan module 512 for scanning a barcode or marking attached to each semiconductor wafer 102 or wafer assembly 100 prior to processing. Scan module 512 scans the barcode or marking upon semiconductor wafer 102 or wafer assembly 100 entering the wafer debonding and cleaning apparatus 500. Scan module 512 transmits the scanned barcode or marking to a computer system to allow tracking of semiconductor wafers 102 and/or the wafer assemblies 100 throughout the production process. The ability to track semiconductor wafers 102 and/or the wafer assemblies 100 throughout the production process allows production errors to be located and corrected rapidly.

The automatic wafer handling module 502 is a robotic arm. In some embodiments, automatic wafer handling module 502 includes multiple robotic arms. In some embodiments, the robotic arm comprises a blade portion 514 configured to support the semiconductor wafer 102 or wafer assembly 100. In some embodiments, the blade portion 514 includes sensors to enhance the positioning of the blade portion 514 with respect to semiconductor wafer 102 or wafer assembly 100 to prevent scratching a surface of semiconductor wafer 102 (FIGS. 1 and 3A-3B). In some embodiments, the blade portion 514 is substantially U-shaped to minimize the amount of contact between the blade portion 514 and the wafer assembly. In other embodiments, the blade portion 514 is circular, rectilinear or another suitable shape for supporting and moving semiconductor wafer 102 or wafer assembly 100. In some embodiments, the blade portion 514 is configured to handle wafer assemblies 100 that include the film frame 108 that supports the semiconductor wafer 102 and/or wafer assemblies 100 or semiconductor wafers 102 that are warped.

In use, automatic wafer handling module 502 removes a wafer assembly from one of the storage units 510 and loads the wafer assembly 100 into wafer debonding module 504. Following loading, wafer assembly 100 is transferred to a debonding stage within the wafer debonding module 504. On the debonding stage, wafer assembly 100 is irradiated to weaken an adhesive 106 bonding semiconductor wafer 102 and carrier wafer 104. In some embodiments, wafer assembly 100 is irradiated with ultraviolet light. In other embodiments, wafer assembly 100 is irradiated with laser light, thermal energy, electromagnetic radiation, or other suitable types of energy to weaken the bond between carrier wafer 104 (FIG. 1) and semiconductor wafer 102. Following irradiation, wafer assembly 100 is transferred off the debonding stage and carrier wafer 104 is lifted off semiconductor wafer 102. In some embodiments, a portion of adhesive 106 remains attached to each of semiconductor wafer 102 and carrier wafer 104. Carrier wafer 104 is cleaned and stored for use with another semiconductor wafer 102. Following the debonding process, semiconductor wafer 102 resembles the structure shown in FIG. 3A.

Automatic wafer handling module 502 removes semiconductor wafer 102 from wafer debonding module 504 following removal of the carrier wafer 104. Automatic wafer handling module 502 then transfers semiconductor wafer 102, shown in FIG. 3A, to a first cleaning module 506 or a second cleaning module 508.

After semiconductor wafer 102 is loaded into the first cleaning module 506 or the second cleaning module 508, semiconductor wafer 102 (FIG. 3A) is positioned on a cleaning stage within the first cleaning module 506 or second cleaning module 508. The cleaning stage is configured to rotate, e.g., by the use of a motor, semiconductor wafer 102. In some embodiments, a nozzle positioned above the cleaning stage supplies a solvent solution onto the surface of semiconductor wafer 102 bonded to residual adhesive 106. In an embodiment, the solvent solution comprises deionized water, tetramethylammonium hydroxide (TMAH), potassium hydroxide (KOH), methylpyrrolidone (NMP), isopropanol (IPA), ethanol, acetone, hydrogen peroxide (H2O2), dimethyl sulfoxide (DMSO), limonene, methanol, and tetrabutylammonium fluoride trihydrate.

In some embodiments, first cleaning module 506 or second cleaning module 508 includes brushes to help remove residual adhesive 106 from semiconductor substrate 102. Some embodiments, first cleaning module 506 or second cleaning module 508 uses the nozzle to spray high pressure air or liquid onto semiconductor wafer 102 to remove residual adhesive 106. In some embodiments, first cleaning module 506 or second cleaning module 508 uses the nozzle to introduce different chemicals onto semiconductor wafer 102 to chemically remove residual adhesive 106 from semiconductor wafer 102. Following completion of the wafer cleaning process, residual adhesive 106 is sufficiently removed from semiconductor wafer 102 for further processing, e.g., packing and dicing, as shown in FIG. 3B. Automatic wafer handling module 502 then removes semiconductor wafer 102 from first cleaning module 506 or second cleaning module 508.

In some embodiments, automatic wafer handling module 502 places a wafer assembly 100 or a semiconductor wafer 102 in one of storage units 510 when the wafer assembly 100 or the semiconductor wafer 102 is not in one of the debonding module 504, first cleaning module 506, or second cleaning module 508. Storage units 510 include support arrangements designed to support a plurality of wafer assemblies 100 or semiconductor wafers 102. In some embodiments, the storage units 510 are cassettes, front opening unified pods (FOUPs), other suitable containers, carriers, support apparatuses, protective covers, or combinations thereof. The spacing between wafer assemblies 100 and/or semiconductor wafers 102 is sufficient to allow the automatic wafer handling module 502 to insert and remove wafer assemblies 100 or semiconductor wafers 102 without contacting adjacent wafer assemblies 100 or semiconductor wafers 102 to avoid damaging stored wafers.

In one embodiment, storage units 510 are stationary. In a wafer debonding and cleaning apparatus 500 which has stationary storage units 510, automatic wafer handling module 502 removes wafer assembly 100 or semiconductor wafer 102 from a first storage unit 510 and loads the wafer assembly 100 or semiconductor wafer 102 into the wafer debonding module 504, the first cleaning module 506, or the second cleaning module 508. In some embodiments, the wafer debonding and cleaning apparatus is in-line with a film frame cleaning module (not shown). At least one storage unit 510 is configured to receive wafer assemblies 100 that include the film frame 108.

After completion of the process in wafer debonding module 504, the first cleaning module 506, or the second cleaning module 508, automatic wafer handling module 502 places wafer assembly 100 or semiconductor wafer 102 in a second storage unit 510 different from the first storage unit 510 in order to move the wafer assemblies 100 or semiconductor wafers 102 further along a processing line. For example, after automatic wafer handling module 502 removes wafer assembly 100 from first storage unit 510 and loads the wafer assembly 100 into wafer debonding module 504, automatic wafer handling module 502 then removes semiconductor wafer 102 from wafer debonding module 504 and places the semiconductor wafer 102 in a second storage unit 510 closer to the first cleaning module 506 or the second cleaning module 508.

In some embodiments, the storage units 510 are configured to correspond with a type of wafer assembly 100 that is stored inside the storage unit 510. In some embodiments, the storage units 510 are configured to correspond with a cleaning process performed by a cleaning module such as first cleaning module 506 or second cleaning module 508. For example, if the first cleaning module 506 or the second cleaning module 508 is configured to perform a different cleaning process or to handle a different type of wafer assembly 100 than the other, the storage units 510 are configured to correspond with an associated cleaning module.

In some embodiments, storage units 510 are movable, e.g., front opening unified pods (FOUPs), and transfer wafer assemblies 100 or semiconductor wafers 102 in groups from a present location to a new location. The new location is either adjacent a different module in wafer debonding and cleaning apparatus 500 or to another apparatus, such as a dicing or packaging apparatus. In a wafer debonding and cleaning apparatus 500 which has movable storage units 510, automatic wafer handling module 502 removes a wafer assembly 100 or semiconductor wafer 102 from storage unit 510 and loads the wafer assembly or the semiconductor wafer 102 into wafer debonding module 504, the first cleaning module 506, or the second cleaning module 508, and returns the wafer assembly 100 or the semiconductor wafer 102 back to the same storage unit 510 following completion of the process in the wafer debonding module 504, the first cleaning module 506, or the second cleaning module 508. Storage unit 510 then moves the wafer to a new location.

Figure 6:
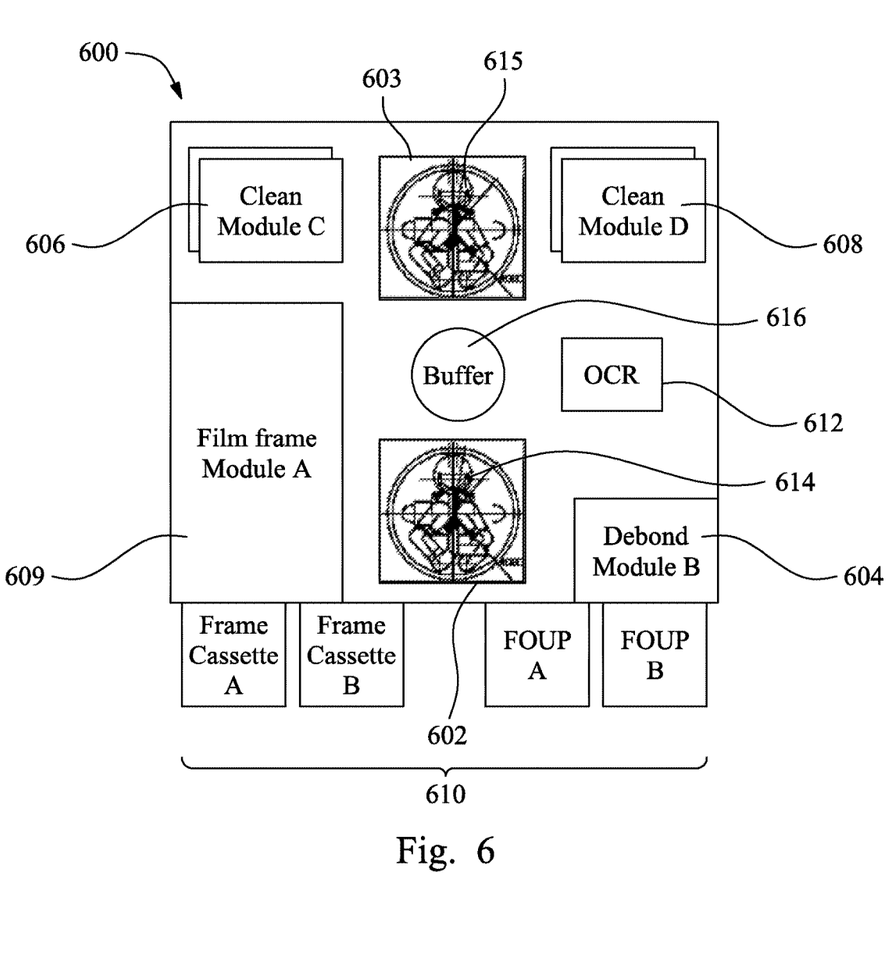
FIG. 6 is a block diagram of a wafer debonding and cleaning apparatus, in accordance with one or more embodiments.

FIG. 6 is a block diagram of a wafer debonding and cleaning apparatus 600, in accordance with one or more embodiments. Wafer debonding and cleaning apparatus 600 includes features similar to those discussed with respect to wafer debonding and cleaning apparatus 500 (FIG. 2), with the reference numerals increased by 100. In some embodiments, wafer debonding and cleaning apparatus 600 is configured to handle wafer assemblies 100 (FIG. 1) that include a film frame 108 (FIG. 1) and/or a semiconductor wafer 102 (FIG. 1) that has a thickness ranging from about 0.20 μm to about 3 mm.

Wafer debonding and cleaning apparatus 600 includes a first automatic wafer handling module 602 for transferring/transporting semiconductor wafer 102 (FIG. 1) to/from various modules of the wafer debonding and cleaning apparatus 600. Wafer debonding and cleaning apparatus 600 further includes a second automatic wafer handling module 603 for transferring/transporting semiconductor wafer 102 (FIG. 1) to/from various modules of the wafer debonding and cleaning apparatus 600.

Wafer debonding and cleaning apparatus 600 includes a wafer debonding module 604 for separating semiconductor wafer 102 from carrier wafer 104 (FIG. 1), two or more first wafer cleaning modules 606 and two or more second wafer cleaning modules 608 for removing adhesive 106 from semiconductor wafer 102. The first wafer cleaning modules 606 and the second wafer cleaning modules 608 are configured to be used for different types of cleaning operations. In some embodiments, first wafer cleaning modules 606 and the second wafer cleaning modules 608 are configured to be used for the same types of cleaning operations.

Wafer debonding and cleaning apparatus 600 has at least one film frame module 609 configured to one or more of clean, apply, or remove a film frame 108 from the wafer assembly 100 or the semiconductor wafer 102. Wafer debonding and cleaning apparatus 600 further includes storage units 610 for storing multiple semiconductor wafers 102 or wafer assemblies 100 (FIG. 1).

Wafer debonding and cleaning apparatus 600 includes an object character recognition (OCR) module 612 similar to scan module 512 (FIG. 5) for scanning a barcode or other marking attached to each semiconductor wafer 102 or wafer assembly 100 prior to processing. OCR module 612 scans the barcode or marking upon semiconductor wafer 102 or wafer assembly 100 entering the wafer debonding and cleaning apparatus 600. OCR module 612 transmits the scanned barcode or marking to a computer system to allow tracking of semiconductor wafers 102 and/or the wafer assemblies 100 throughout the production process. The ability to track semiconductor wafers 102 and/or the wafer assemblies 100 throughout the production process allows production errors to be located and corrected rapidly.

The first automatic wafer handling module 602 is a robotic arm. In some embodiments, first automatic wafer handling module 602 includes multiple robotic arms. The second automatic wafer handling module 603 is a robotic arm. In some embodiments, second automatic wafer handling module 603 includes multiple robotic arms. In some embodiments, the robotic arms of the first automatic wafer handling module 602 and the second automatic wafer handling module 603 respectively comprise a first blade portion 614 and a second blade portion 615 configured to support the semiconductor wafer 102 or wafer assembly 100.

In some embodiments, the first blade portion 614 and/or the second blade portion 615 include sensors to enhance the positioning of the first blade portion 614 and/or the second blade portion 615 with respect to semiconductor wafer 102 or wafer assembly 100 to prevent scratching a surface of semiconductor wafer 102 (FIGS. 1 and 3A-3B). In some embodiments, the first blade portion 614 and/or the second blade portion 615 is substantially U-shaped to minimize the amount of contact between the first blade portion 614 and/or the second blade portion 615 and the wafer assembly 100 or the semiconductor wafer 102. In other embodiments, the first blade portion 614 and/or the second blade portion 615 is circular, rectilinear or another suitable shape for supporting and moving semiconductor wafer 102 or wafer assembly 100.

The first blade portion 614 and/or the second blade portion 615 is configured to handle wafer assemblies 100 that include a film frame 108 that supports the semiconductor wafer 102 and/or wafer assemblies 100 or semiconductor wafers 102 that are warped. In some embodiments, the first automatic wafer handling module 602 and the first blade portion 614 are configured to interact with the film frame module 609 and the wafer debonding module 604, while the second automatic wafer handling module 603 is configured to interact with the first cleaning module 606 and the second cleaning module 608. In some embodiments, the first automatic wafer handling module 602 and the second automatic wafer handling module 603 are configured to hand-off the wafer assembly 100 or the semiconductor wafer 102 to one another. In some embodiments, the wafer debonding and cleaning apparatus comprises a stage or buffer module 616 upon which, or within which, the wafer assembly 100 or the semiconductor wafer 102 is placed by one of the first automatic wafer handling module 602 or the second automatic wafer handling module 603 for retrieval by the other of the first automatic wafer handling module 602 or the second automatic wafer handling module 603. The buffer module 616 polishes a semiconductor wafer 102 before and/or after being subjected to the debonding and cleaning processes performed by the wafer debonding module 604, the two or more first wafer cleaning modules 606, and/or the two or more second wafer cleaning modules 608. The buffer module 616 polishes the semiconductor wafer 102 to remove or reduce residual adhesive or debris that exists on the semiconductor wafer 102 following or in preparation for the debonding and cleaning processes performed by the wafer debonding module 604, the two or more first wafer cleaning modules 606, and/or the two or more second wafer cleaning modules 608. Having the buffer module 616 or a stage in place of the buffer module 616 between the first automatic wafer handling module 602 and the second automatic wafer handling module 603 enables the first automatic wafer handling module 602 and the second automatic wafer handling module 603 to move other wafer assemblies 100 or semiconductor wafers 102 while a semiconductor wafer 102, for example, is being processed by the buffer 616 or awaiting transfer, increasing production efficiency and throughput.

In use, first automatic wafer handling module 602 removes a wafer assembly 100 from one of the storage units 510 and loads wafer assembly 100 into wafer debonding module 604. Alternatively, the first automatic wafer handling module 602 removes a wafer assembly 100 from the film frame module 609 and loads the wafer assembly 100 into wafer debonding module 604. Following loading, wafer assembly 100 is transferred to a debonding stage within the wafer debonding module 604. On the debonding stage, wafer assembly 100 is irradiated to weaken an adhesive 106 bonding semiconductor wafer 102 and carrier wafer 104. In some embodiments, wafer assembly 100 is irradiated with ultraviolet light. In other embodiments, wafer assembly 100 is irradiated with laser light, thermal energy or other suitable types of energy to weaken the bond between carrier wafer 104 (FIG. 1) and semiconductor wafer 102. Following irradiation, wafer assembly 100 is transferred off the debonding stage and carrier wafer 104 is lifted off semiconductor wafer 102. In some embodiments, a portion of adhesive 106 remains attached to each of semiconductor wafer 102 and carrier wafer 104. Carrier wafer 104 is cleaned and stored for use with another semiconductor wafer 102. Following the debonding process, semiconductor wafer 102 resembles the structure shown in FIG. 3A.

First automatic wafer handling module 602 removes semiconductor wafer 102 from wafer debonding module 604 following removal of the carrier wafer 104. First automatic wafer handling module 602 then transfers semiconductor wafer 102, shown in FIG. 3A, to the stage, buffer 616 or second automatic wafer handling unit 603. The second automatic wafer handling unit 603 then transfers the semiconductor wafer 102 to one of the first cleaning modules 606 or the second cleaning modules 608.

After the cleaning process within the first cleaning module 606 or the second cleaning module 608 is completed, second automatic wafer handling module 603 removes semiconductor wafer 102 from first cleaning module 606 or second cleaning module 608 and transfers the semiconductor wafer 102 to the stage, buffer 616 or first automatic wafer handling unit 602. In some embodiments, the second automatic wafer handling module 603 loads the semiconductor wafer 102 into the other of the first cleaning module 606 or the second cleaning module 608 for a subsequent cleaning process. As such, after the subsequent cleaning process within the first cleaning module 606 or the second cleaning module 608 is completed, second automatic wafer handling module 603 removes semiconductor wafer 102 from first cleaning module 606 or second cleaning module 608 and transfers the semiconductor wafer 102 to the stage, buffer 616 or first automatic wafer handling unit 602.

The first automatic wafer handling module 602 transfers the cleaned wafer assembly 100 or a semiconductor wafer 102 to one of storage units 610. If the wafer assembly 100 or the semiconductor wafer 102 is not in debonding module 604, first cleaning module 606, second cleaning module 608 or film frame module 609, the first automatic wafer handling module 602 transfers the wafer assembly 100 or the semiconductor wafer 102 to one of the storage units 610. In some embodiments, one or more of the storage units 610 are configured to align and to mate with the film frame module 609 to transfer wafer assemblies 100 and/or semiconductor wafers 102 into and out of a mated storage unit 610. Similarly, in some embodiments, one or more of the storage units 610 are configured to align and to mate with the wafer debonding module 604 to transfer wafer assemblies 100 and/or semiconductor wafers 102 into and out of a mated storage unit 610.

Storage units 610 include support arrangements designed to support a plurality of wafer assemblies 100 or semiconductor wafers 102, including those that have film frames 108. In some embodiments, the storage units 610 are cassettes, front opening unified pods (FOUPs), other suitable containers, carriers, support apparatuses, protective covers, or combinations thereof. The spacing between wafer assemblies 100 is sufficient to allow the first automatic wafer handling module 602 to insert and remove wafer assemblies 100 or semiconductor wafers 102 without contacting adjacent wafer assemblies 100 or semiconductor wafers 102 to avoid damaging stored wafers.

The above-discussed embodiments relating to wafer debonding and cleaning simplify the wafer debonding and cleaning process, which improves production efficiency and throughput, thereby reducing production costs. The above-discussed embodiments relating to wafer debonding and cleaning use one or more automatic wafer handling modules that are configured to avoid common mishandling of thin semiconductor wafers that have a thickness ranging from about 0.20 μm to about 3 mm. Such mishandling often causes production defects which results in production yield loss. Usage of the discussed one or more automatic wafer handling modules reduces production defects and production yield losses by reducing the opportunities for a thin wafer to be mishandled.

The above-discussed embodiments relating to wafer debonding and cleaning, in some embodiments, are capable of handling thin semiconductor wafers that have a thickness ranging from about 0.20 μm to about 3 mm that are supported by a film frame. Manual cleaning processes for thin semiconductor wafers is time consuming, reduces production efficiency, and increases the opportunity to mishandle a thin wafer. The discussed embodiments relating to wafer debonding and cleaning use one or more cleaning modules that are configured to accommodate and clean a thin semiconductor wafer with or without a film frame. By debonding and cleaning a wafer supported by a film frame, common costs and production yield losses associated with attachment of a film frame to a thin semiconductor wafer are reduced or eliminated.

An aspect of this description relates to a wafer debonding and cleaning apparatus. The wafer debonding and cleaning apparatus comprises a wafer debonding module configured to separate a semiconductor wafer from a carrier wafer. The wafer debonding and cleaning apparatus also comprises a first wafer cleaning module configured perform a first cleaning process to clean a surface of the semiconductor wafer. The wafer debonding and cleaning apparatus further comprises an automatic wafer handling module configured to transfer the semiconductor wafer from one of the wafer debonding module or the first wafer cleaning module to the other of the wafer debonding module or the first wafer cleaning module. The semiconductor wafer has a thickness ranging from about 0.20 μm to about 3 mm.

Another aspect of this description relates to a method of debonding a wafer and cleaning a wafer. The method comprises separating a semiconductor wafer from a carrier wafer using a wafer debonding module. The method also comprises cleaning a surface of the semiconductor wafer using a first wafer cleaning module. The method further comprises transferring the semiconductor wafer from one of the wafer debonding module or the first wafer cleaning module to the other of the wafer debonding module or the first wafer cleaning module using an automatic wafer handling module. The semiconductor wafer has a thickness ranging from about 0.20 μm to about 3 mm.

A further aspect of this description relates to a wafer debonding and cleaning apparatus. The wafer debonding and cleaning apparatus comprises a wafer debonding module configured to separate a semiconductor wafer from a carrier wafer. The wafer debonding and cleaning apparatus also comprises a first wafer cleaning module configured to clean a surface of the semiconductor wafer. The wafer debonding and cleaning apparatus further comprises a second wafer cleaning module configured to clean the surface of the semiconductor wafer. The wafer debonding and cleaning apparatus additionally comprises a film frame cleaning module configured to clean the semiconductor wafer. The wafer debonding and cleaning apparatus also comprises an automatic wafer handling module configured to transfer the semiconductor wafer into and out of the wafer debonding module, the first wafer cleaning module, and the film frame cleaning module. The semiconductor wafer has a thickness ranging from about 0.20 μm to about 3 mm.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A wafer debonding and cleaning apparatus comprising:
    a wafer debonding module configured to separate semiconductor wafers from carrier wafers;
    a first wafer cleaning module configured to perform a first cleaning process to clean surfaces of a first plurality of the semiconductor wafers;
    a second wafer cleaning module configured to perform a second cleaning process to clean surfaces of a second plurality of the semiconductor wafers;
    a storage unit configured to store multiple wafer assemblies respectively having one of the semiconductor wafers bonded to one of the carrier wafers by an adhesive;
    a first automatic wafer handling module comprising a first robotic arm; and
    a second automatic wafer handling module comprising a second robotic arm that is separated from the storage unit by the first automatic wafer handling module and that is located between the first wafer cleaning module and the second wafer cleaning module, wherein the second automatic wafer handling module is configured to transfer the first plurality of the semiconductor wafers from the first automatic wafer handling module directly to the first wafer cleaning module and to transfer the second plurality of the semiconductor wafers from the first automatic wafer handling module directly to the second wafer cleaning module.

2. The wafer debonding and cleaning apparatus of claim 1, wherein the storage unit is moveable and is configured to mate with the wafer debonding module.

3. The wafer debonding and cleaning apparatus of claim 1,
    wherein the second automatic wafer handling module is separated from the storage unit along a first line extending along a first direction and wherein the second automatic wafer handling module is separated from the first wafer cleaning module and the second wafer cleaning module along a second line extending along a second direction; and
    wherein the first line is perpendicular to the second line.

4. The wafer debonding and cleaning apparatus of claim 1, wherein a film frame directly contacts and completely covers sidewalls of one of the semiconductor wafers, the film frame configured to support the one of the semiconductor wafers after removal of one of the carrier wafers from the one of the semiconductor wafers.

5. The wafer debonding and cleaning apparatus of claim 4, further comprising:
    a film frame cleaning module configured to clean the one of the semiconductor wafers having the film frame.

6. The wafer debonding and cleaning apparatus of claim 5, further comprising:
    a buffer module configured to polish the semiconductor wafers, wherein the buffer module is located between the first automatic wafer handling module and the second automatic wafer handling module.

7. The wafer debonding and cleaning apparatus of claim 6, wherein the second automatic wafer handling module is closer to both the first wafer cleaning module and the second wafer cleaning module than the first automatic wafer handling module.

8. The wafer debonding and cleaning apparatus of claim 5, wherein the storage unit is a movable storage unit.

9. A wafer debonding and cleaning apparatus comprising:
    a wafer debonding module configured to perform a wafer debonding process to separate semiconductor wafers from carrier wafers;
    a first wafer cleaning module configured to clean surfaces of a first plurality of the semiconductor wafers;
    a second wafer cleaning module configured to clean surfaces of a second plurality of the semiconductor wafers, wherein the first wafer cleaning module and the second wafer cleaning module are configured to perform a same type of cleaning operation;
    an automatic wafer handling module configured to transfer the semiconductor wafers into and out of the wafer debonding module, the first wafer cleaning module, and the second wafer cleaning module, wherein the semiconductor wafers have thicknesses ranging from about 0.20 um to about 3 mm; and
    a storage unit comprising a front opening unified pod (FOUP), wherein the FOUP is arranged along a first side of the automatic wafer handling module and is configured to mate to the wafer debonding module, and wherein the first wafer cleaning module and the second wafer cleaning module are arranged along a second side of the automatic wafer handling module opposing the first side.

10. The wafer debonding and cleaning apparatus of claim 9, wherein the automatic wafer handling module comprises:
    a robotic arm configured to support the semiconductor wafers; and
    a blade portion configured to handle a warped semiconductor wafer.

11. The wafer debonding and cleaning apparatus of claim 9,
    wherein the storage unit is configured to align and to mate directly with a film frame module that is configured to apply or remove a film frame from respective ones of the semiconductor wafers.

12. The wafer debonding and cleaning apparatus of claim 9, wherein the automatic wafer handling module is configured to transfer the first plurality of the semiconductor wafers from the wafer debonding module directly to the first wafer cleaning module and to transfer the second plurality of the semiconductor wafers from the wafer debonding module directly to the second wafer cleaning module.

13. The wafer debonding and cleaning apparatus of claim 9, wherein a film frame is in direct contact with sidewalls of respective ones of the first plurality of the semiconductor wafers and the second plurality of the semiconductor wafers.

14. A workpiece debonding and cleaning apparatus, comprising:
a debonding module configured to separate semiconductor workpieces from carrier workpieces;
a first cleaning module configured to perform a first cleaning operation on a first plurality of the semiconductor workpieces;
a second cleaning module configured to perform a second cleaning operation, which is a same type as the first cleaning operation, on a second plurality of the semiconductor workpieces different than the first plurality of the semiconductor workpieces;
an automatic workpiece handling module configured to transfer the semiconductor workpieces from the debonding module to the first cleaning module or to the second cleaning module;
a control unit configured to determine if the first cleaning module and the second cleaning module are in use and to operate the automatic workpiece handling module to transfer one of the semiconductor workpieces from the debonding module directly to either the first cleaning module or to the second cleaning module depending on the determined use of the first cleaning module and the second cleaning module; and
a storage unit configured to store the first plurality of the semiconductor workpieces, wherein the storage unit is moveable and is configured to store multiple wafer assemblies and to align to and to mate with the debonding module, and wherein the automatic workpiece handling module is configured to transfer the first plurality of the semiconductor workpieces from the storage unit to the debonding module and to return the first plurality of the semiconductor workpieces from the debonding module to the storage unit.

15. The workpiece debonding and cleaning apparatus of claim 14, wherein the storage unit comprises a front opening unified pod (FOUP).

16. The workpiece debonding and cleaning apparatus of claim 14, wherein the debonding module is configured to utilize laser light, thermal energy, or electromagnetic radiation to weaken bonds between the carrier workpieces and the semiconductor workpieces.

17. The workpiece debonding and cleaning apparatus of claim 14, wherein the first cleaning module is configured to remove an adhesive material from the semiconductor workpieces using a solvent solution comprising a mixture of deionized water, tetramethylammonium hydroxide, potassium hydroxide, methylpyrrolidone, isopropanol, ethanol, acetone, hydrogen peroxide, dimethyl sulfoixde, limonene, menthanol, and tetrabutylammonium fluoride trihydrate.

18. The workpiece debonding and cleaning apparatus of claim 14, further comprising:
a scanning element configured to scan barcodes or markings associated with the semiconductor workpieces prior to the automatic workpiece handling module providing the semiconductor workpieces to the debonding module, the first cleaning module, or the second cleaning module.

19. The workpiece debonding and cleaning apparatus of claim 14, further comprising:
a buffer module configured to polish the semiconductor workpieces; and
a second automatic workpiece handling module, wherein the buffer module is arranged spatially between the automatic workpiece handling module and the second automatic workpiece handling module.

20. The workpiece debonding and cleaning apparatus of claim 19, further comprising:
a film frame module configured to apply or remove a film frame from respective ones of the semiconductor workpieces, wherein the film frame is configured to support the semiconductor workpieces in an absence of the carrier workpieces; and
wherein the automatic workpiece handling module is arranged spatially between the film frame module, the debonding module, and the buffer module; and
wherein the second automatic workpiece handling module is arranged spatially between the first cleaning module, the second cleaning module, and the buffer module.

* * * * *